United States Patent

[19]

Roy et al.

[11] Patent Number: 6,025,762

[45] Date of Patent: Feb. 15, 2000

[54] DELAY LINE INCORPORATING A SURFACE ACOUSTIC WAVE LADDER FILTER AND METHOD OF PROVIDING SAME

[75] Inventors: Manas K. Roy, Vernon Hills, Ill.; David Penunuri, Fountain Hills, Ariz.; Thomas S. Hickernell, Mesa, Ariz.

[73] Assignee: CTS Corporation, Elkhart, Ind.

[21] Appl. No.: 09/228,898

[22] Filed: Jan. 11, 1999

[51] Int. Cl.[7] .................................................. H03H 9/42
[52] U.S. Cl. ........................... 333/150; 333/153; 330/174
[58] Field of Search ..................... 333/193–196, 333/150, 151, 153, 154; 310/313 R, 313 B; 330/151, 174

[56] References Cited

U.S. PATENT DOCUMENTS

| Re. 35,204 | 4/1996 | Lewis .................................. 333/154 X |
| 3,950,713 | 4/1976 | Lewis ..................................... 333/151 |
| 3,971,993 | 7/1976 | Constant ............................. 330/149 X |
| 3,979,697 | 9/1976 | Donahue ............................. 333/150 X |
| 4,458,221 | 7/1984 | Suzuki .................................... 333/196 |
| 4,535,296 | 8/1985 | Hagg Chehade et al. .............. 329/103 |
| 4,635,007 | 1/1987 | Magill .................................... 333/153 |
| 5,796,307 | 8/1998 | Kumagai et al. ................... 330/151 X |
| 5,874,866 | 2/1999 | Satoh et al. ......................... 333/193 X |

FOREIGN PATENT DOCUMENTS 4-367103  12/1992  Japan .
10-32431  2/1998  Japan .

OTHER PUBLICATIONS

"Design of Surface Acoustic Wave Delay Lines With Interdigital Transducers", Smith et al., IEEE Transactions on Microwave Theory & Techniques, vol. MTT–17, No. 11, pp. 865–873, Nov. 1969.

*Primary Examiner*—Robert Pascal
*Assistant Examiner*—Barbara Summons
*Attorney, Agent, or Firm*—Jones, Day, Reavis & Pogue

[57] ABSTRACT

A method (100) of providing a time delay to a signal utilizing a surface acoustic wave ladder filter includes a first step (102) of providing a piezoelectric substrate. A second step (104) includes disposing series and shunt coupled surface acoustic wave transducers in a ladder configuration on the substrate with each of the transducers having an associated aperture and an associated number of interdigital electrode elements. A third step (106) includes configuring the associated aperture and an associated number of interdigital electrode elements for each surface acoustic wave transducer for maximum phase linearity of the ladder filter and uniform group delay response from the ladder filter. A fourth step (108) includes adjusting the number of transducers in the ladder filter to provide a desired average group delay. Subsequently passing a signal through the ladder filter will delay the signal by a time equal to the group delay.

11 Claims, 6 Drawing Sheets

DELAY LINE INCORPORATING A SURFACE ACOUSTIC WAVE LADDER FILTER AND METHOD OF PROVIDING SAME

FIELD OF THE INVENTION

This invention relates in general to the field of radio frequency apparatus, in particular to radio frequency delay lines and more particularly to radio frequency delay lines employing surface acoustic wave devices.

BACKGROUND OF THE INVENTION

There is an ongoing need for component miniaturization in radio communication devices. For example, smaller and more efficient components are needed for radio communication infrastructure (base stations) including cellular telephones, pager devices and other devices for promoting rapid, efficient and flexible voice and data communication. Delay lines are needed for a variety of such communications applications wherein small size, low cost and high performance are simultaneously required.

Surface acoustic wave (SAW) in-line delay lines are a popular choice for radios because of their low loss and small size advantages. These in-line SAW delay lines are fabricated with in-line interdigital transducers on piezoelectric substrates wherein the propagation of a surface acoustic wave from an input transducer to an output transducer gives rise to delays ranging from about 500 ns to over 10 $\mu$s. Unfortunately, where shorter delays are required such as in linear power amplifiers that employ feedforward techniques to reduce distortion, the input and output transducers are in close proximity to each other which results in a direct electromagnetic feedthrough spurious signal, which is difficult to suppress. In addition, an in-line SAW configuration generates "triple transit" and other spurious reflection signals. All of these spurious signals cause amplitude and phase ripples within a passband of the SAW device, and it is difficult to achieve a linear phase output to less than about 2.5 degrees.

Alternatively, a coaxial transmission line can be used to provide an electromagnetic delay line. Coaxial transmission line provides good phase linearity. However, since the speed of a signal in coaxial transmission line is about 100,000 times that of an acoustic signal in a SAW device, a much longer signal path is needed to provide the requisite delay. For example, to provide a 25 ns delay a coaxial cable length of about 20 feet is needed. Such a cable is very expensive and bulky, even when coiled upon itself. Of course, longer delays require longer cable and higher cost. This is a major disadvantage towards the development of miniature base stations, but has been the only option where delay times less than 100 ns are needed.

What is needed is a delay line configuration that provides the phase linearity needed in today's radio communication devices while having a short delay time. In addition, low signal loss and suppressed spurious signal generation would be an advantage. It is also desirable to provide a delay line that can be implemented at a low cost and in a compact form.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

The exemplification set out herein illustrates a preferred embodiment of the invention in one form thereof, and such exemplification is not intended to be construed as limiting in any manner.

DETAILED DESCRIPTION OF THE PREFERRED EMBODIMENT

The present invention provides a delay line configuration including a SAW ladder filter that provides good phase linearity at a short delay time. In addition, the SAW ladder filter provides low signal loss and suppressed spurious signals as compared to an in-line SAW device. Advantageously, the delay line of the present invention can be implemented at a low cost and in a much more compact form than prior art coaxial transmission lines.

Figure 1:
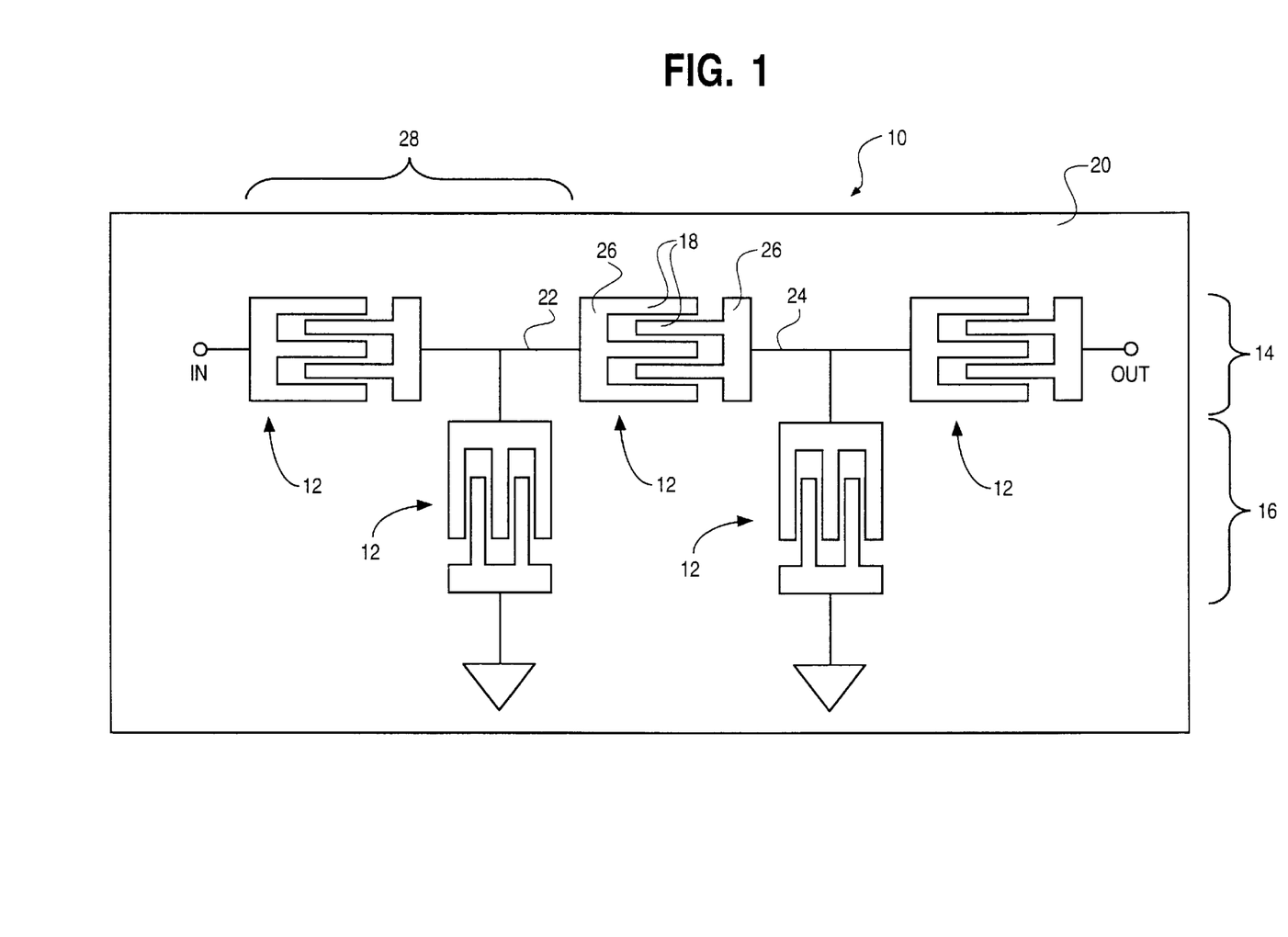
FIG. 1 shows a simplified top plan view of a five-element SAW ladder filter showing the interdigital electrodes of each SAW resonator.

FIG. 1 shows a surface acoustic wave ladder filter 10 which consists of individual surface acoustic wave resonator transducers 12 coupled in alternating series 14 and shunt connections 16. Each surface acoustic wave transducer 12 comprises a resonator including interdigitated electrodes 18 (also referred to as "fingers", "finger electrodes", etc.) disposed on a piezoelectric substrate 20 (and coupled alternately to a first terminal 22 or a second terminal 24 via respective bus bars 26. The resonator optionally includes reflectors (not shown) disposed to either side of the resonator, as is known in the art.

The interdigitated electrodes typically are periodic and define a particular acoustic wavelength at which the transducer exhibits a characteristic acoustic center frequency together with a center frequency wavelength for the acoustic energy transduced in response to electrical stimulation of an appropriate frequency applied via the two terminals. The electrodes are usefully one-fourth of this center frequency wavelength wide, i.e., measured along directions in accordance with design principles and performance objectives for the resonator. The electrodes are disposed on one-half acoustic wavelength centers.

Electrical stimulation at an appropriate frequency supplied from electrical terminals to bus bars and thence to interdigitated or interleaved electrodes results in acoustic waves being generated within transducer. As used herein, the term "acoustic wavelength" is taken to mean an acoustic wavelength at the filter center frequency, i.e., in the nominal center of the filter passband.

The resonator is typically fabricated on a polished surface of a piezoelectric substrate by depositing and patterning a thin metal film, often comprising aluminum, in a thickness ranging from about 50 nm (500 Å) to about 600 nm (6000 Å), by techniques similar to those employed in integrated circuit manufacturing, and with direction carefully aligned with a preferred crystallographic axis to provide the desired acoustic transduction, propagation and reflection characteristics as are known in the art.

In traditional acoustic filters employing ST-cut quartz resonant elements, electromechanical coupling coefficient $k^2$ is typically much smaller than 0.5%, limiting the fractional bandwidth (bandwidth divided by center frequency) achievable for such filters to very small values. In the present invention, it is preferable to use higher coupling coefficient materials (e.g., LiNbO$_3$, LiTaO$_3$, lithium tetraborate, etc.) which provide a greater spread between resonant and anti-resonant frequencies, as is known in the art. For example, 64° LiNbO$_3$ provides a coupling coefficient of about 10.5%, 41° LiNbO$_3$ provides a coupling coefficients of about 17%, and 36° and 42° LiTaO$_3$ provide a coupling coefficients of about 7.5%. This increased frequency spread in turn allows further design freedom.

A SAW ladder filter 10, as shown in FIG. 1, also known as an impedance element filter, consists of interdigital transducers 12 whose impedance varies with frequency similarly to a classic LC (inductance-capacitance) resonator or quartz crystal resonator. The basic unit of a ladder filter is an "L-section" 28 composed of two SAW transducer resonators, one connected as a series element and the other connected as a shunt element. Using classic circuit theory, several such "L-sections" can be cascaded to achieve a desired filter response. However, the present invention makes use of the group delay of a SAW ladder filter to achieve a required signal delay by increasing the number of "L-sections", unlike the prior art.

In particular, the present invention provides the required signal delay by means of the group delay response of the ladder filter. Minimum deviation from phase linearity (uniform group delay) is achieved by varying the aperture of the transducers, the number of elements in the transducers or both. More particularly, the present invention takes advantage of the group delay response of a SAW ladder filter to achieve the short delay times needed in a linear feedforward amplifier.

Group delay is defined as the change in phase of a signal over a change in frequency. In the present invention it is desired to provide a linear change in phase over frequency as this results in a constant (flat) group delay. In this way, any frequency signal within a desired range passing through the ladder filter is delayed by the same amount, corresponding to the group delay value.

In practice, there is usually a tradeoff between providing flat frequency response in a filter and flat group delay. Prior art ladder filters have been drawn towards providing flat frequency response, as is their purpose. The present invention is used not in its function as a filter, but in a time delay function. Therefore, the frequency response provided by the present invention is less of a factor than in prior art SAW filters, and the SAW device must be configured differently. Moreover, time delay is not defined by acoustic velocity, as in prior art in-line SAW delay lines, but by the impedance characteristics of individual resonators in a ladder network.

It is known in the art that discrete element LC ladder filters can be configured to provide a flat group delay response. These filters are typically referred to as Gaussian or Bessel filters, among others. Examples of such filter configurations can be found in "Handbook of Filter Synthesis" by Zverev, published by Wiley and Sons, 1967. The present invention seeks to configure transducers in a SAW ladder filter to act as impedances appropriate to provide a flat group delay response. However, changing resonator impedances in a SAW ladder filter is not as simple as changing an inductance or capacitance in a prior art LC ladder network. Therefore, using Gaussian or Bessel models are not appropriate for the present invention.

In a SAW transducer the magnitude of the impedance at the synchronous frequency is proportional to L/A, where L is the periodic length of the transducer in a direction of acoustic wave propagation and A is the aperture (width of the acoustic beam set by the overlapping length of the interdigital electrode fingers). Therefore, L and A must be adjusted to obtain not only the appropriate center frequency but also the required impedance and delay.

A SAW transducer can be conveniently modeled as a series RLC circuit (e.g., a resistor of resistance R, in series with an inductor having inductance L, in series with a capacitor having motional capacitance $C_m$) bridged by a capacitor having a larger capacitance $C_o$, as is known in the art.

Values for components $C_o$, $C_m$, L, R are determined the geometry of the transducer and relevant material constants. R may be usefully estimated as zero (i.e., ignored) or may be modeled from empirical data. Values of a few ohms are often encountered in practice. R represents bulk wave radiation, acoustic propagation away from the receiving transducer, metal resistivity, diffraction effects and other losses encountered in acoustic resonant elements. The Q of the resonant circuit is modeled with the resistance R.

Static capacitance $C_o$ is found from:

$$C_o = C_e NA \qquad (1)$$

where $C_e$ is a material parameter describing capacitance per finger pair per cm (tabulated for many materials in a variety of textbooks), N represents the number of transducer finger pairs (e.g., pairs of electrodes 18 in transducer 12, FIG. 1) and A represents the overlap of electrodes or beamwidth aperture in cm. Motional capacitance $C_m$ is related to static capacitance $C_o$ by:

$$C_m = \frac{8k^2 C_o}{2} \qquad (2)$$

where $k^2$ represents the electromechanical coupling coefficient (tabulated in a variety of textbooks related to piezoelectric materials). Motional inductance L is given by:

$$L = \frac{1}{c_m \omega_r^2} \qquad (3)$$

where $\omega_r$ represents the radian transducer resonant frequency. The transducer has a resonant frequency at which the resonant arm of the equivalent circuit provides a low impedance path across the resonator. Admittance Y measured across the resonator is:

$$Y = j\omega C_o + \frac{1}{R + j(\omega L - (1/\omega c_m))} \qquad (4)$$

As can be seen, the motional capacitance and the static capacitance have a direct effect on the impedance of the resonator, and subsequently the ultimate phase response of the filter. This is unlike prior art LC circuits where static capacitance is not a concern. As a result, the aperture and number of electrode pairs for each resonator must be optimized for proper impedance and thus linear phase.

However, providing good phase linearity alone does not guarantee the appropriate amount of group delay. Good phase linearity only ensures that the group delay is uniform over the band of desired frequencies. The absolute amount of group delay is determined by the number of SAW transducers in the ladder filter. Increasing the number of ladder stages increases the absolute group delay. Therefore, the present invention contemplates not only the requirement for linear phase response, but also the requirement for a predetermined amount of absolute group delay.

Figure 2:
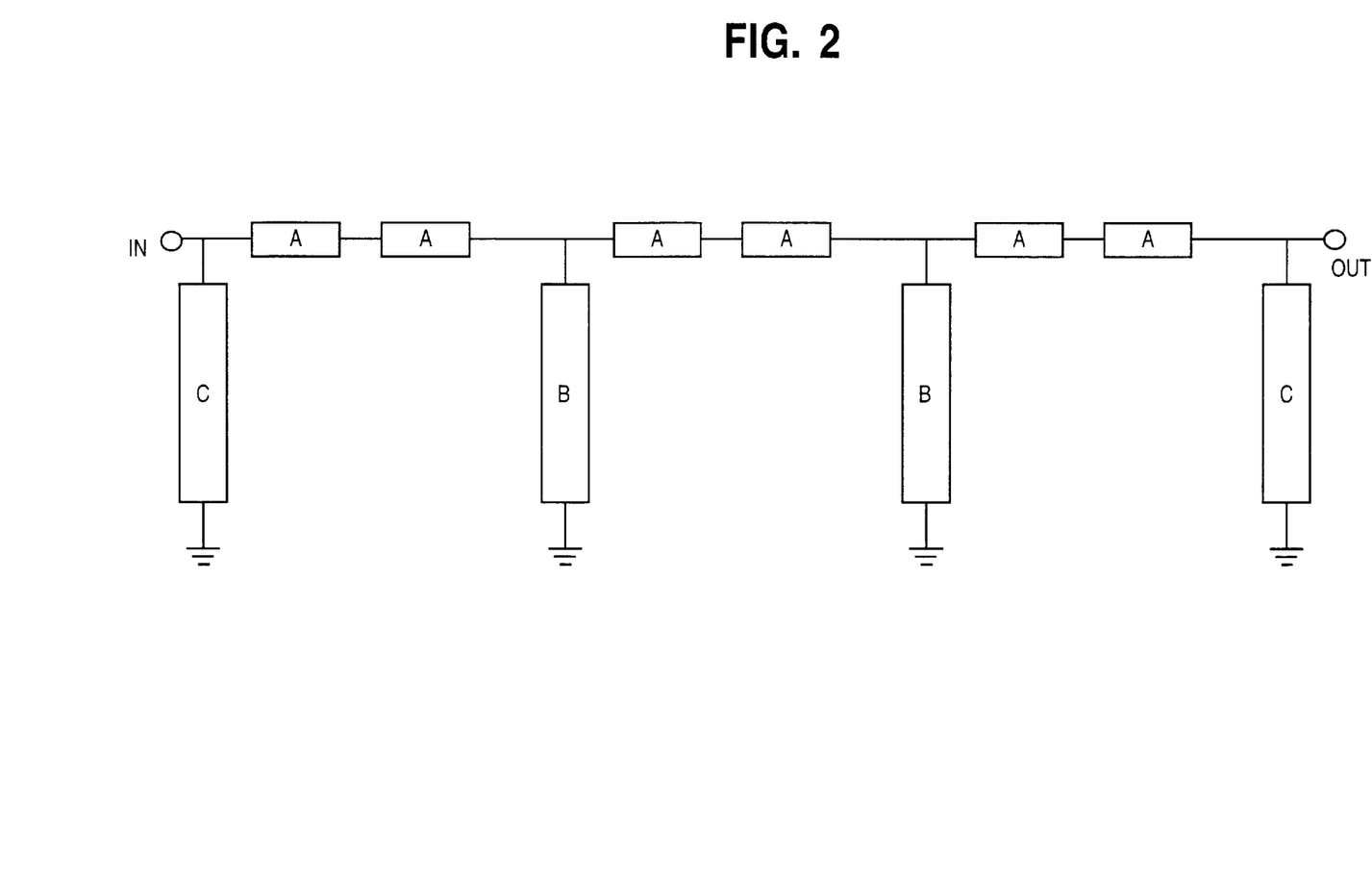
FIG. 2 shows a simplified schematic diagram of a delay line incorporating a SAW ladder filter, in accordance with the present invention.

FIG. 2 shows a specific delay line/ladder filter configuration, in accordance with the present invention. Although a ten element ladder filter is shown, it is possible to provide a ladder filter having as little as one series element and one shunt element. As the number of elements (resonators) increase the insertion loss degrades, but the absolute delay increases. Therefore, it is desired to use the minimum number of element necessary to provide the desired group delay. To meet the example given in the specification, ten SAW elements were used. Dual series resonators are supplied for practicality reasons, and are therefore preferred. However, single series elements could be used. The ladder filter is typically specified to have a passband bandwidth about a center frequency.

In the present invention a center frequency of 865 MHz and a bandwidth of 20 MHz was chosen and the delay line was configured as shown in FIG. 2. Three different resonator configurations were used: A,B,C. Resonator A has a resonant frequency of 862.32 MHz, $C_o$ is 2.04 pF, N is 151, electrode periodicity is 4.8724 μm, A is 8.2 wavelengths, $C_e$ is 0.676 pF/mm, and capacitance ratio is 0.1641. Resonator B has a resonant frequency of 780.98 MHz, $C_o$ is 15.28 pF, N is 301, electrode periodicity is 5.3268 μm, A is 26.24 wavelengths, $C_e$ is 0.727 pF/mm, and capacitance ratio is 0.2166. Resonator C has a resonant frequency of 794.00 MHz, $C_o$ is 5.92 pF, N is 301, electrode periodicity is 5.2802 μm, A is 10.91 wavelengths, $C_e$ is 0.683 pF/mm, and capacitance ratio is 0.1823. The delay line as modeled above was constructed incorporating the above considerations on a 42° Y-cut X-propagating lithium niobate SAW substrate, and was configured to present fifty ohm terminations.

In prior art SAW ladder filters, the application was in the front-end of a receiver, and the important criteria were the rejection of out of band frequencies and the minimization of inband loss. In the present invention, rejection is not critical, but the delay and the flatness of delay are the main criteria. Prior art SAW ladder filters try to achieve greater rejection by equating the resonant frequencies of series and shunt elements. However, in the present invention, the series and shunt resonant frequencies are very far apart.

EXAMPLE

The present invention is illustrated by an example of a delay line configuration as described above and in FIG. 2 and requiring a minimum of 25 dB return loss. A computer simulation was performed assuming the SAW device configuration of FIG. 2.

Figure 7:
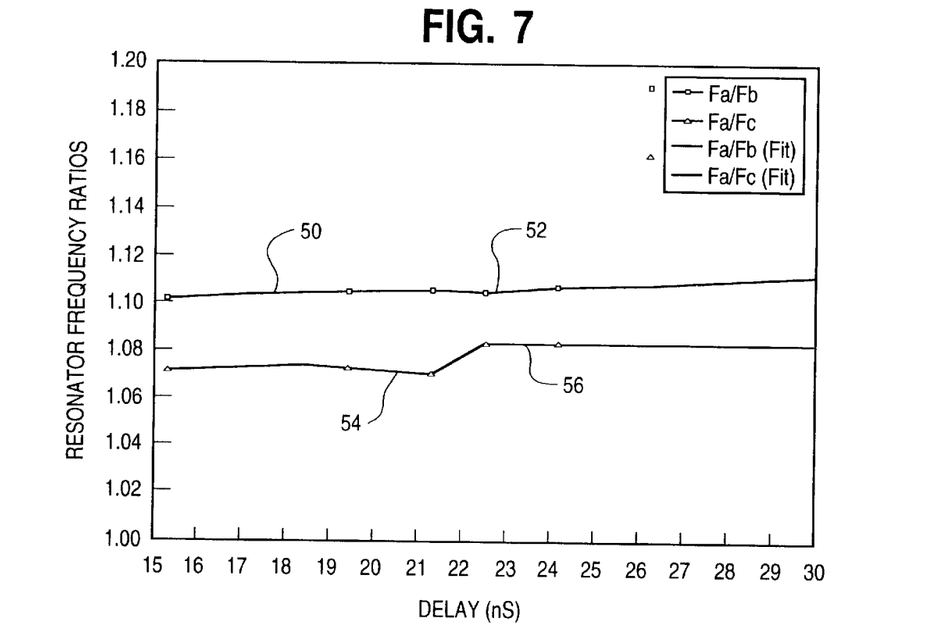
FIG. 7 shows a graph of resonator frequency ratios versus delay time for the resonators of the delay line of FIG. 2.

Surprisingly, the simulation results indicated that the resonant frequencies of the resonators must be constrained to certain ratios. FIG. 7 shows a first and second plot 50,54 of the ratios of Fa/Fb and Fa/Fc versus a desired delay time, where Fa, Fb and Fc are the resonant frequencies of resonators A, B and C, respectively. First and second straight-line data fit 52,56 plots are also shown having a corresponding relationship to the desired delay time, t(ns), given by $$Fa/f = A[1 + B(t-C)]$$

where, when f represents Fb: A=1.107, B=0.0006, and C=23 ns, and when f represents Fc: A=1.077, B=0.0008, and C=23 ns. As can be seen, the series surface acoustic wave transducers have a resonant frequency that is greater than 1.07 times that of the outer shunt transducers directly connected to the input and output of the ladder filter, and greater than 1.1 times that of the inner shunt transducers coupled through the series transducers to the input and output. These are much higher ratios than are expected from the prior art.

Figure 8:
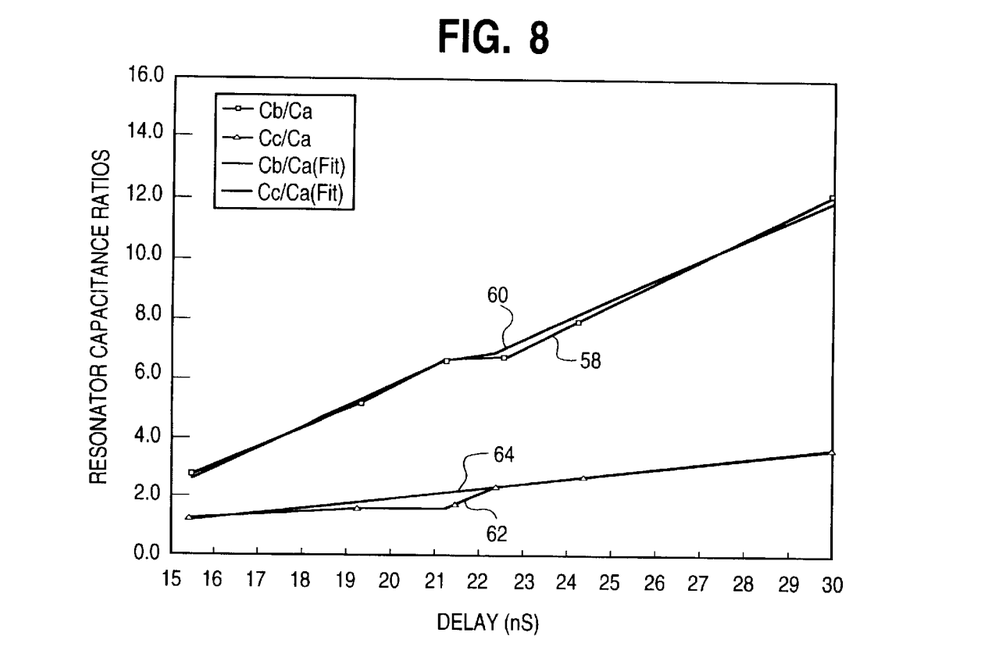
FIG. 8 shows a graph of resonator capacitance ratios versus delay time for the resonators of the delay line of FIG. 2.

The simulation further shows that the capacitances of the resonators must also be constrained to certain ratios. FIG. 8 shows a first and second plot 58,62 of the ratios of Cb/Ca and Cc/Ca versus a desired delay time, where Ca, Cb and Cc are the capacitances of resonators A, B and C, respectively. First and second straight-line data fit 60,64 plots are shown having a corresponding relationship to the desired delay time, t(ns), given by $$c/Ca = A'[1 + B'(t-C')]$$

where, when c represents Cb: A'=7.4, B'=0.085, and C'=23 ns, and when f represents Fc: A'=2.4, B'=0.070, and C'=23 ns. As can be seen, the series surface acoustic wave transducers having a capacitance that is less than one-half that of the outer shunt transducers directly connected to the input and output of the ladder filter, and less than one-seventh that of the inner shunt transducers coupled through the series transducers to the input and output. These are also much different ratios than are expected from the prior art.

It should be recognized that the specific capacitances of the resonators are determined by the particular impedance level desired of the delay line. It should also be recognized that the physical interpretation of the above relationships are accomplished with detailed design models which include the effects of geometry dependent material parameters.

It was found that, to a high degree of accuracy, the frequency ratios of the resonators are proportional to the transducer pitch ratios, and that the capacitance ratios of the resonators are proportional to the transducer beamwidth-length product ratios.

Figure 3:
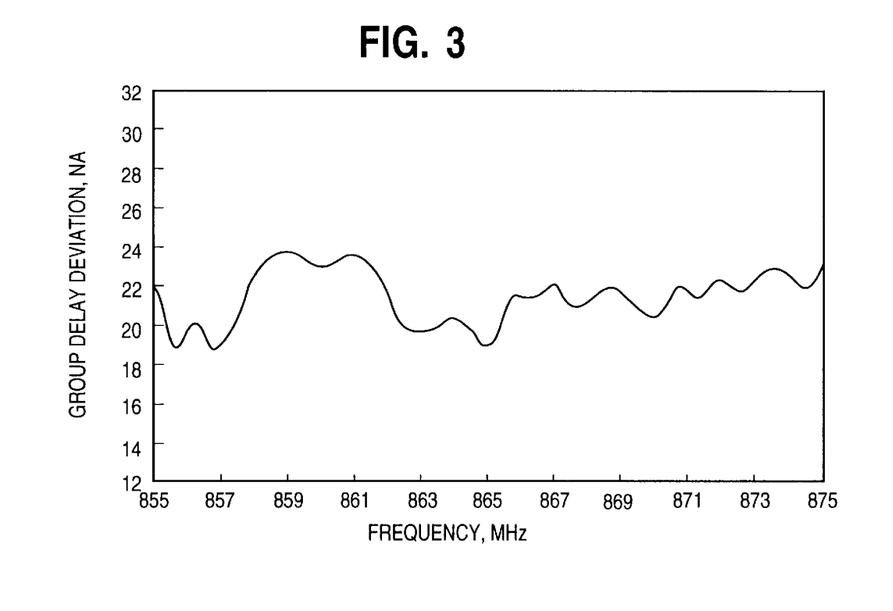
FIG. 3 shows a graph of the group delay response for the delay line of FIG. 2.
Figure 4:
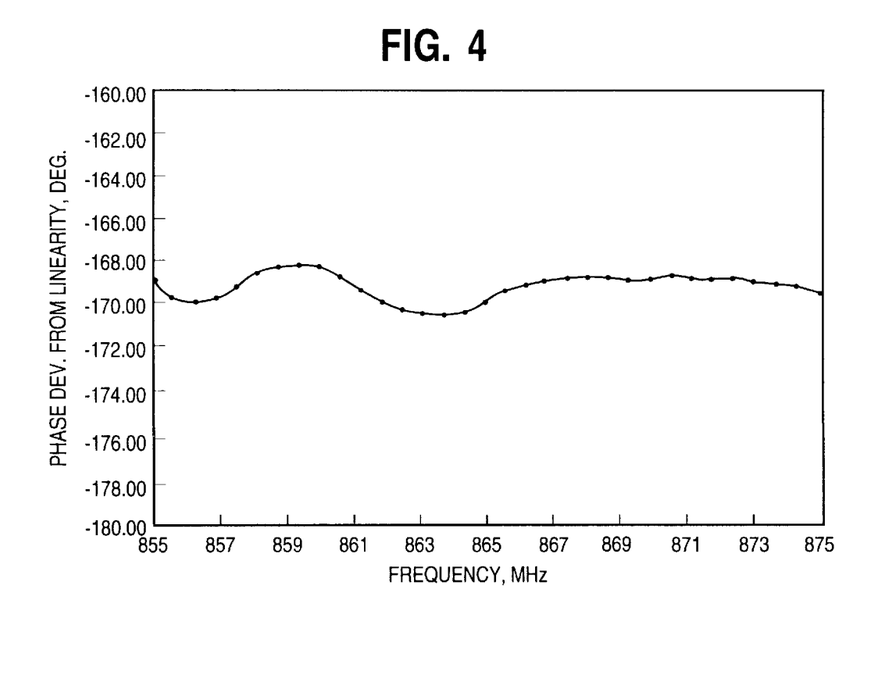
FIG. 4 shows a graph of the phase deviation for the delay line of FIG. 2.

FIG. 3 shows the measured group delay response of the delay line of FIG. 2, configured as described above. As can be seen, this particular filter shows a group delay in the bandwidth of interest of about 22 ns. This delay can be easily increased by adding an appropriate number of "L-sections" of the ladder filter, or by cascading two filters, or both. In addition, the delay line was separately tested for its phase deviation from linearity. The measurements, as shown in FIG. 4, confirmed a phase linearity deviation of less than 2.5 degrees in the bandwidth of interest which is a requirement of feedforward amplifiers in today's radio communication base stations. Surprisingly, the ladder filter in the present invention also provided an insertion loss of less than 5 dB and a return loss of less than −20 dB, which is also advantageous in a radio application.

It should be recognized that the above description is only used as an example and is in no way limiting. Surface acoustic wave devices and especially SAW resonators can be readily scaled in frequency by changing the pitch (periodicity) of the resonator transducer fingers while maintaining the resonator impedance. In particular, the beam aperture must be varied inversely as the desired synchronous frequency, keeping L/A constant (L being the periodic length of the transducer and A being the aperture), such that the transducer impedance remains unchanged at the synchronous frequency. This allows a designer to re-use a similar design at a slightly different center frequency having similar specifications or permits a quick, two iteration convergence to a desired set of delay characteristics when the relationship between the resonant frequency and the transducer impedance is not known a priori (e.g., on very high coupling coefficient materials where conventional approximations tend to provide poorer design guidance).

Figure 5:
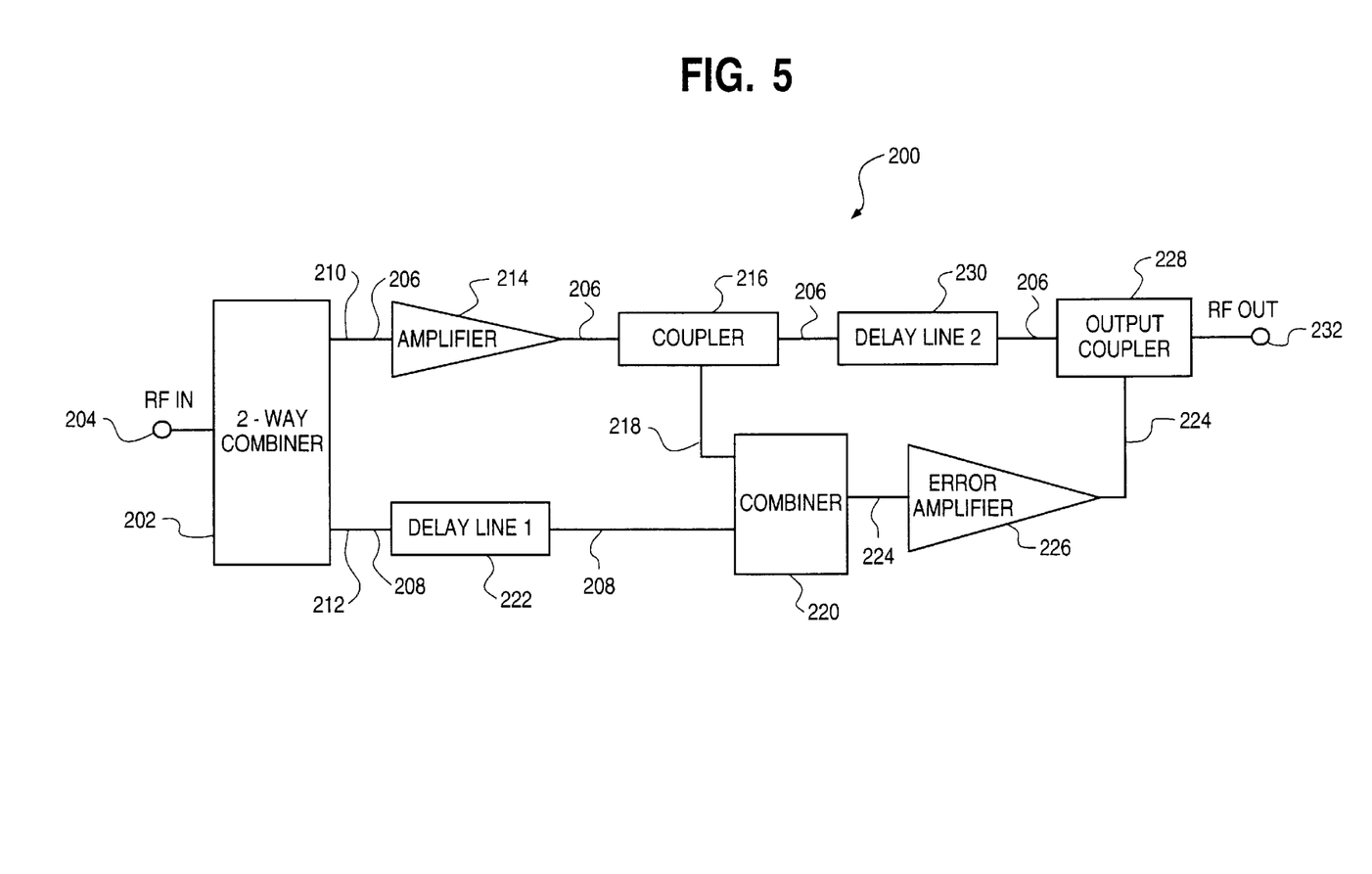
FIG. 5 shows a simplified schematic diagram of a portion of a feedforward amplifier apparatus including the delay line of FIG. 2, in accordance with the present invention.

FIG. 5 is a block diagram of a portion of a feed forward amplifier apparatus 200 in a radio communication device, in accordance with the present invention. In particular, the feedforward amplifier is coupled in an output of a base station for cellular phone or paging use. The portion of the feed forward amplifier apparatus 200 includes a two-way combiner 202 which receives an "RF in" transmit signal 204 and splits it into a first and second signal 206, 208 at a respective first and second outputs 210,212. The first signal 206 on the first output 210 of the two-way combiner 202 is amplified in a main amplifier 214 and sent to a coupler 216. A portion 218 of the first signal 206, attenuated to be about equal in amplitude to the second signal 208, is split off in the coupler 216 and sent to a combiner 220.

The second signal 208 on the second output 212 of the two-way combiner 202 is connected through a first delay line 222, which incorporates the ladder filter of the present invention, to the combiner 220. The first delay line 222 provides a signal delay to the second signal 208 which compensates for the signal delay of the first signal 206 and the portion 218 of the first signal through the main amplifier 214 and coupler 216 such that the second signal 208 and the portion 218 of the first signal are substantially out of phase at the combiner 220. Therefore, any signal 224 subsequently produced from the combiner 220 is an indication of an error in the first signal 206 introduced by the main amplifier 214. The error is actually the distortion produced by non-linearities in the main amplifier 214.

This error signal 224 is amplified in an error amplifier 226 to bring it up to an amplitude about equal to the amplitude of the first signal 206, and sent to an output coupler 228. The first signal 206 is delayed in a second delay line 230 and also coupled to the output coupler 228. The second delay line 230 is an electromagnetic interdigital filter, as is known in the art, and provides a signal delay which compensates for the signal delay through the combiner 220 and the error amplifier 226 such that the error signal 224 and the first signal 206 are substantially combined in phase in the output coupler 228. In this way, the error signal 224 substantially cancels any error in the first signal 206 introduced by the main amplifier 214 before transmitting it to "RF out" 232 and an antenna (not shown). The feedforward technique minimizes the main amplifier induced distortions to make the amplifier as linear as possible.

The arrangement of the present invention may be used to provide any or all of the delay lines 222,230. Preferably, only the first delay line 222 incorporates the ladder filter of the present invention as this is at a lower power (about one watt) than what the second delay line experiences. At much over one watt, SAW devices typically experience shorter lifetimes than is acceptable.

Figure 6:
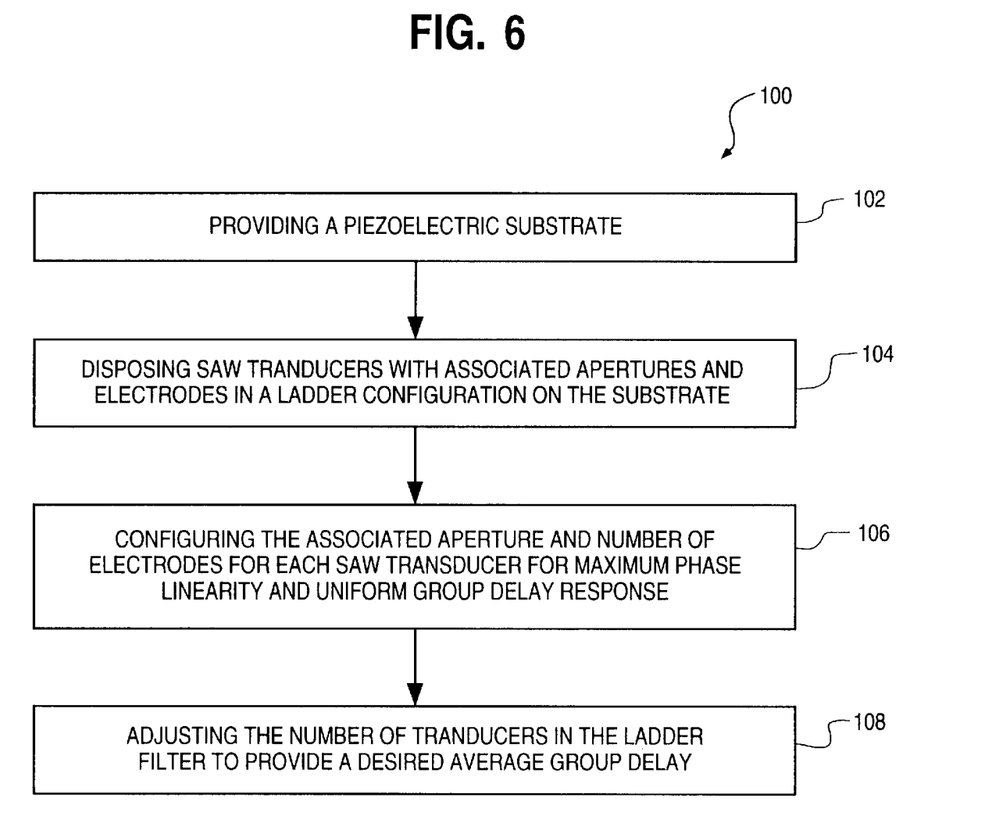
FIG. 6 shows a block diagram of a method to provide a delay line, in accordance with the present invention.

The present invention also incorporates a method 100 of providing a time delay to a signal utilizing a surface acoustic wave ladder filter, as represented in FIG. 6. The method 100 includes a first step 102 of providing a piezoelectric substrate, as are mentioned above. A second step 104 includes disposing series and shunt coupled surface acoustic wave transducers in a ladder configuration on the substrate with each of the transducers having an associated aperture and an associated number of interdigital electrode elements, as described above. A third step 106 includes configuring the associated aperture and an associated number of interdigital electrode elements for each surface acoustic wave transducer for maximum phase linearity of the ladder filter and uniform group delay response from the ladder filter, as previously described. A fourth step (108) includes adjusting the number of transducers in the ladder filter to provide a desired average group delay, such that subsequently passing a signal through the ladder filter will delay the signal by a time equal to the group delay.

Thus, a SAW delay line device has been described which overcomes specific problems and accomplishes certain advantages relative to prior art methods and mechanisms. The improvements over known technology are significant. The problems of prior art delay lines are avoided. Further, improved phase linearity is realized for a compact and low cost device together with provisions for short delay times unachievable in the prior art.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the broad scope of the appended claims.

What is claimed is:

1. A method of providing a time delay to a signal utilizing a surface acoustic wave ladder filter with an input and an output, the method comprising the steps of:

providing a piezoelectric substrate;

disposing series and shunt coupled surface acoustic wave transducers in a ladder configuration on the substrate with each of the transducers having an associated aperture and an associated number of interdigital electrode elements;

configuring the associated aperture and an associated number of interdigital electrode elements for each surface acoustic wave transducer for maximum phase linearity of the ladder filter and uniform group delay response from the ladder filter; and adjusting the number of transducers in the ladder filter to provide a desired average group delay.

2. The method of claim 1, wherein the configuring step includes configuring an impedance of each transducer of the delay line to provide a substantially linear phase response.

3. The method of claim 1, wherein the disposing step includes disposing two series connected surface acoustic wave transducers to be coupled between each shunt transducer, the series surface acoustic wave transducers having a resonant frequency that is greater than 1.07 times that of the outer shunt transducers directly connected to the input and output of the ladder filter, and greater than 1.1 times that of the inner shunt transducers coupled through the series transducers to the input and output.

4. The method of claim 3, wherein the disposing step includes the series surface acoustic wave transducers having a capacitance that is less than one-half that of the outer shunt transducers directly connected to the input and output of the ladder filter, and less than one-seventh that of the inner shunt transducers coupled through the series transducers to the input and output.

5. The method of claim 1, wherein the configuring step includes configuring the number of electrode pairs in each shunt surface acoustic wave transducer to be about twice that of each series surface acoustic wave transducer.

6. A delay line incorporating a surface acoustic wave ladder filter, the delay line comprising:

a piezoelectric substrate; and series and shunt coupled surface acoustic wave transducers disposed on the substrate and connected in a ladder configuration thereon, each of the transducers having an associated aperture and an associated number of interdigital electrode elements;

each of the associated aperture and an associated number of interdigital electrode elements for each surface acoustic wave transducer is configured for maximum phase linearity of the ladder filter and uniform group delay response from the ladder filter;

the number of transducers in the ladder filter being adjusted to provide a desired average group delay.

7. The delay line of claim 6, wherein an impedance of each transducer of the delay line is configured to provide a substantially linear phase response.

8. The delay line of claim 6, wherein two series connected surface acoustic wave transducers are coupled between each shunt transducer, the series surface acoustic wave transducers having a resonant frequency that is greater than 1.07 times that of the outer shunt transducers directly connected to the input and output of the ladder filter, and greater than 1.1 times that of the inner shunt transducers coupled through the series transducers to the input and output.

9. The delay line of claim 8, wherein the series surface acoustic wave transducers have a capacitance that is less than one-half that of the outer shunt transducers directly connected to the input and output of the ladder filter, and less than one-seventh that of the inner shunt transducers coupled through the series transducers to the input and output.

10. The delay line of claim 6, wherein the number of electrode pairs in each shunt surface acoustic wave transducer is about twice that of each series surface acoustic wave transducer.

11. A feedforward amplifier utilizing a delay line incorporating a surface acoustic wave ladder filter, the delay line comprising:

a piezoelectric substrate; and series and shunt coupled surface acoustic wave transducers disposed on the substrate and connected in a ladder configuration thereon, each of the transducers having an associated aperture and an associated number of interdigital electrode elements;

each of the associated aperture and an associated number of interdigital electrode elements for each surface acoustic wave transducer is configured for maximum phase linearity of the ladder filter and uniform group delay response from the ladder filter;

the number of transducers in the ladder filter being adjusted to provide a desired average group delay.

* * * * *